(12) United States Patent
Keski-Jaskari et al.

(10) Patent No.: US 10,761,638 B2
(45) Date of Patent: Sep. 1, 2020

(54) DETECTION OF PIEZOELECTRIC SENSOR ELEMENTS (71) Applicant: Aito BV, Amsterdam (NL)

(72) Inventors: Turo Keski-Jaskari, Tuusula (FI); Jukka Riihiaho, Vantaa (FI)

(73) Assignee: Aito BV, Amsterdam (NL)

(*) Notice: Subject to any disclaimer, the term of this patent is extended or adjusted under 35 U.S.C. 154(b) by 0 days.

(21) Appl. No.: 16/308,114

(22) PCT Filed: Jun. 9, 2017

(86) PCT No.: PCT/EP2017/064127
§ 371 (c)(1),
(2) Date: Dec. 7, 2018

(87) PCT Pub. No.: WO2017/212028
PCT Pub. Date: Dec. 14, 2017

(65) Prior Publication Data
US 2019/0179472 A1    Jun. 13, 2019

Related U.S. Application Data (60) Provisional application No. 62/347,609, filed on Jun. 9, 2016.

(51) Int. Cl.
*G06F 3/041* (2006.01)
*H03K 17/96* (2006.01)

(52) U.S. Cl.
CPC .......... *G06F 3/0414* (2013.01); *G06F 3/0416* (2013.01); *H03K 17/9643* (2013.01);
(Continued)

(58) Field of Classification Search
CPC ................. G06F 3/0414; G06F 3/0416; G06F 2203/04104; H03K 17/9643; H03K 2217/0036
See application file for complete search history.

(56) References Cited

U.S. PATENT DOCUMENTS 6,720,712 B2 * 4/2004 Scott .................... G06K 9/0002
310/316.01
8,810,105 B2    8/2014 Rönning et al.
(Continued)

FOREIGN PATENT DOCUMENTS

DE    10 2014 107 786 A1    12/2015
EP        0 933 873 A1     8/1999
(Continued)

OTHER PUBLICATIONS

International Search Report for corresponding International Patent Application No. PCT/EP2017/064127 dated Aug. 24, 2017, 4 pages.
(Continued)

*Primary Examiner* — Afroza Chowdhury
(74) *Attorney, Agent, or Firm* — Merchant & Gould P.C.

(57) ABSTRACT

A detection of piezoelectric sensor elements is provided. According to a first aspect, a device comprises: a matrix of piezoelectric sensor elements comprising rows of the piezoelectric sensor elements and columns of the piezoelectric sensor elements; measuring circuits configured to detect at least one touch, wherein the measuring circuits are configured to the rows and to the columns; and a wake-up trigger configured to detect the at least one touch and further configured to trigger the matrix to an operation mode when the at least one touch is detected. The device is configured for detecting a press event of a plurality of piezoelectric sensor elements, using, for example only a single activity detecting and touch recognition circuit. Complexity and energy consumption may be reduced.

18 Claims, 4 Drawing Sheets

(52) U.S. Cl.
CPC .............. *G06F 2203/04104* (2013.01); *H03K 2217/0036* (2013.01)

(56) References Cited

U.S. PATENT DOCUMENTS

| | | | | |
|---|---|---|---|---|
| 8,946,973 B2* | 2/2015 | Pelletier | ................ | G06F 1/3203 |
| | | | | 310/318 |
| 2002/0053857 A1* | 5/2002 | Scott | .................... | G06K 9/0002 |
| | | | | 310/314 |
| 2005/0174015 A1* | 8/2005 | Scott | .................... | G06K 9/0002 |
| | | | | 310/334 |
| 2009/0250267 A1* | 10/2009 | Heubel | ................... | G06F 3/016 |
| | | | | 178/18.03 |
| 2015/0123931 A1* | 5/2015 | Kitchens | ............... | G06F 3/0436 |
| | | | | 345/174 |

FOREIGN PATENT DOCUMENTS

| | | |
|---|---|---|
| EP | 1 266 346 A2 | 12/2008 |
| EP | 2 144 138 A1 | 1/2010 |
| EP | 2 315 101 A1 | 4/2011 |

OTHER PUBLICATIONS

Written Opinion of the International Searching Authority for corresponding International Patent Application No. PCTEP2017/064127 dated Aug. 24, 2017, 7 pages.

* cited by examiner

DETECTION OF PIEZOELECTRIC SENSOR ELEMENTS

This application is a National Stage Application of PCT/EP2017/064127, filed 9 Jun. 2017, which claims benefit of U.S. Provisional Patent Application Ser. No. 62/347,609, filed 9 Jun. 2016 and which applications are incorporated herein by reference. To the extent appropriate, a claim of priority is made to each of the above disclosed applications.

TECHNICAL FIELD

The present application relates generally to a touch user interface of an electronic device, and more specifically piezoelectric sensing for the touch user interface

BACKGROUND

For touch user interface the sensing of touch can be divided into two stages: Firstly, to detect if the interface is touched and secondly recognize the touch event being press, swipe or any type of action made by a user. Such a touch user interface can be realized by using piezoelectric sensor elements each element corresponding to a discrete touch point of the user interface. In the simplest case each piezoelectric sensor element may correspond to a touch switch. In many user interfaces there is a need to plurality of discrete touch switches or touch points, as an example up to 100 or more for QWERTY keyboards.

Now, if the electric signals of many piezoelectric sensor elements are monitored for touch detection in touch user interface, then as one configuration either one monitoring apparatus per piezoelectric sensor element is required, or as alternative configuration many piezoelectric sensor elements are connected to one monitoring apparatus through a multiplexer. In the first configuration the current consumption of such apparatus increases with increasing the amount of piezoelectric sensor elements in the apparatus, since each monitoring sample in the apparatus having multiple piezoelectric sensor elements requires current to operate. In the second configuration each piezoelectric sensor element must continuously be polled by selecting it with the multiplexer to collect monitoring sample. The continuous polling requires current to operate, also in the inactive stage of the apparatus, when the piezoelectric sensor elements are not producing any signal. This is needed for the apparatus to be able to detect when any one of piezoelectric sensor element starts to produce the signal and consequently apparatus can be changed to active stage for touch detection.

In both configurations, of apparatus being equal amount of monitoring apparatus and piezoelectric sensor elements and configuration of multiplexing piezoelectric sensor element signals to single monitoring apparatus, there are constant and significant energy consumption of the apparatus in inactive stage.

Also in both configurations the energy consumption of the apparatus significantly increases with the amount of piezoelectric sensor elements.

In the first configuration of the apparatus mentioned above, the number of wires and the number of connections required to connect electrically each of the piezoelectric sensor elements, increase linearly with the number of piezoelectric sensor elements required to be monitored. As a consequence, apparatus has complex and bulky mechanical and electromechanical structure, which turns into increased manufacturing cost, lower reliability and limited density of the piezoelectric sensor elements in the user interface since large number of circuit elements and wires are required to electrically connect each of the piezoelectric sensor elements.

In the second configuration of the apparatus mentioned above, the multiplexing, or alternatively time interleaved detection of signal originated from each piezoelectric sensor element, there are less wires and components and space required to electrical connections. On the other hand polling of all the piezoelectric sensor elements in the apparatus may turn out to be too time consuming for reliable touch signal detection due to the limitations of polling speed of all piezoelectric sensor elements, especially with the long settling times required for signals in high impedance measurement. Acceleration of the polling speed can be used to improve the signal detection reliability, but it results in increased power consumption of the apparatus and the performance requirements for the touch detection circuitry, for example sampling speed and accuracy required from the analog-to-digital converter in touch detection circuitry.

It is also possible to use commonly known matrix detection method, where there are active signal fed to the matrix of piezoelectric sensor elements consisting of columns and rows, and as the response to the fed signal there is detection of the change in the signal transfer characteristics as a function of touch at one or more of the switches or touch points. In this alternative of the detection apparatus feeding the active signal would require even higher electrical energy compared to the polling in multiplexed signals and the feeding the signal should be in continuous manner regardless is the user interface touched or not. As a result the electrical power consumption of the apparatus is too high for typical requirement of the touch keypad user interfaces.

Piezoelectric sensing based on charge accumulated by deforming the piezoelectric sensor element is proven to be the most energy efficient method for touch sensing (for example patent reference U.S. Pat. No. 8,810,105). However, there is no reliable and fast enough detection method of touch detection in keypads with plurality of touch switches.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object to provide detection of piezoelectric sensor elements. The object is achieved by the features of the independent claims. Further implementation forms are provided in the dependent claims, the description and the figures.

According to a first aspect, a device comprises: a matrix of piezoelectric sensor elements comprising rows of the piezoelectric sensor elements and columns of the piezoelectric sensor elements; measuring circuits configured to detect at least one touch, wherein the measuring circuits are configured to the rows and to the columns; and a wake-up trigger configured to detect the at least one touch and further configured to trigger the matrix to an operation mode when the at least one touch is detected. The device is configured for detecting a press event of a plurality of piezoelectric sensor elements, using, for example only a single activity detecting and touch recognition circuit. Complexity and energy consumption may be reduced.

In a possible implementation of the device, the matrix is configured to a low-power mode, stand-by mode or inactive mode, until the matrix is triggered by the wake-up trigger.

In another possible implementation of the device, the wake-up trigger is configured to maintain an analog comparator to monitor the detection of the at least one touch.

In another possible implementation of the device, the wake-up trigger is configured to maintain an analog to digital converter, ADC, channel to monitor the detection of the at least one touch.

In another possible implementation of the device, further including a controller configured to detect different sensitivity threshold based on the at least one touch or multiple touches in order to recognize different kind of touch events.

In another possible implementation of the device, the controller is configured to detect multiple touches of the matrix at same time.

In another possible implementation of the device, the controller is configured to detect predetermined signal differences on pairs of rows and columns in order to detect the multiple touches.

In another possible implementation of the device, the controller is configured to detect a signal difference between a signal of the at least one touch and any other piezoelectric sensor element originated signal in order to recognize the at least one touch and ignore the other piezoelectric sensor element originated signal.

In another possible implementation of the device, other measuring circuits connected to the rows and columns, where the piezoelectric sensor elements are not touched, detect significantly lower signals in comparison to measuring circuits connected to the rows and columns, where the piezoelectric sensor element is touched.

In another possible implementation of the device, the controller is configured to detect a polarity of a signal of the at least one touch and a polarity of any other signal of the piezoelectric sensor element and compare the signals in order to identify the at least one touch.

In another possible implementation of the device, the wake-up trigger comprises an analogy comparator configured to monitor a voltage difference between isolated common reference nets, and wherein the wake-up trigger further comprises a switch, wherein the comparator is configured to turn the switch on for activating the matrix to the operation mode.

In another possible implementation of the device, the wake-up trigger comprises an analog to digital channel configured to monitor a voltage difference between isolated common reference nets, and wherein the wake-up trigger further comprises a switch, wherein the controller is configured to turn the switch on for activating the matrix to the operation mode.

In another possible implementation of the device, further including a resistor in parallel to the switch.

In another possible implementation of the device, the measuring circuits comprise signal conditioning filters and detection devices.

In another possible implementation of the device, the measuring circuits are configured to only for each row and each column.

In another possible implementation of the device, the measuring circuits further comprise one or more controlled switches configured to multiplex channels of each row and each column.

According to another aspect, a method comprises: detecting, by measuring circuits, at least one touch, wherein the measuring circuits are configured to rows and to columns, and wherein a matrix of piezoelectric sensor elements comprises the rows of the piezoelectric sensor elements and the columns of the piezoelectric sensor elements; and detecting, by a wake-up trigger, the at least one touch; and triggering the matrix to an operation mode when the at least one touch is detected.

According to a third aspect, a computer program is provided, comprising program code configured to perform a method according to the second aspect when the computer program is executed on a computer.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings. List of reference numerals may as follows according to an embodiment.

10 piezoelectric sensor element matrix, 4 times 4 as an example;

11A-11P individual piezoelectric sensor elements, all are alike with manufacturing tolerances;

12A-12D channel selection switch to select appropriate row of the matrix for a given ADC input;

13A-13D channel selection switch to select appropriate column of the matrix for a given ADC input;

14 isolation switch to disconnect two parts of the VREF net into separate common reference nets 141 and 142 in a stand-by state, so that voltage difference between common reference nets 141 and 142 can be detected with ADC 33;

21A-21H signal conditioning filter: bandwidth limitation, amplitude scaling;

30 controller device (microcontroller chip) to detect and interpret piezoelectric sensor element signals with HW and SW, and to control the operation and configuration of the system;

31A-31H analog-to-Digital converter (ADC) functions inside the controller 30, wherein one ADC for each input channel of the controller 30, or a single ADC, which can be internally multiplexed to several input channels of the controller 30;

32 signal reference bias voltage (VREF) generation for the piezoelectric sensor element matrix 10 and the ADCs 31;

33 ADC conversion channel to measure voltage difference of common reference nets 141 and 142;

141 common reference net for the rows of the matrix of piezoelectric sensor elements 11;

142 common reference net for the columns of the matrix of piezoelectric sensor elements 11;

143 analog comparator to measure voltage difference of common reference nets 141 and 142;

144 digital input of the controller device 30, to monitor output of 143;

145 resistor with high ohmic value, for example 560 kOhm, to provide common reference nets 141 and 142 with equal DC bias voltage during the switch 14 is disconnected;

15 wire from of piezoelectric sensor element matrix 10 to signal conditioning filter 21, either related to a row or a column;

21 piezoelectric sensor element signal conditioning filter: bandwidth limitation, amplitude scaling;

22, 23 piezoelectric sensor element signal scaling resistors, as voltage divider circuit to attenuate incoming signal, wherein values of resistors 22 and 23 can be adjusted, or resistor 22 shorted and resistor 23 removed, according to the desired signal scaling;

24 resistor, to make low pass frequency filter together with capacitor 25, wherein value can be changed according to the desired characteristics;

25 capacitor, to make low pass frequency filter together with resistor 24, wherein value can be changed according to the desired characteristics.

35 power supply voltage of the controller device 30;

36A, 36B reference voltage generation circuitry to provide adequate level for the common reference net 140;

37 ground level of the controller device 30;

140 common reference net for the piezoelectric sensor element 11 signals.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

Accordingly, it may be desirable for a detection circuitry in form of a matrix, having rows and columns in a manner, to reduce the complexity of wiring and energy consumption for reliable touch detection and recognition of the signal produced by piezoelectric sensor element. Furthermore, it may be desirable to be able to keep the detection circuitry in a low power mode in inactive stage of the user interface, while there is no touch detection of individual piezoelectric sensor elements needed, and wake it up when user interface is needed to turn to active stage, in the manner that only the energy accumulated by the piezoelectric sensor element is used to trigger the wake-up. The energy is originated from users applying the pressure while touching to user interface, and converted to electrical charge by bending the piezoelectric sensor element.

According to an embodiment, a device comprises a matrix of piezoelectric sensor elements comprising rows of the piezoelectric sensor elements and columns of the piezoelectric sensor elements. Each piezoelectric sensor element may detect a touch. The device has measuring circuits configured to detect the at least one touch, wherein the measuring circuits are configured to the rows and to the columns. The detection may be based on the rows and the columns and their respective electronics. Furthermore, a wake-up trigger is configured to detect the at least one touch and further configured to trigger the matrix to an operation mode when the at least one touch is detected. The matrix may be resting in a stand-by mode and consume very few power. Consequently, the device is configured for detecting a press event of a plurality of piezoelectric sensor elements, using, for example only a single activity detecting and touch recognition circuit. The device has a matrix with rows and columns of piezoelectric sensor elements and their respective detection electronics in order to reduce complexity and energy consumption of the touch keypads.

The complexity of the electronics between the piezoelectric sensor element matrix 10 and the microcontroller 30 is reduced as there is no need to have an ADC channel 31, conditioning filter 21 and wiring separately for each piezoelectric sensor element 11. Instead, there may be measuring circuits only for each row and each column of the piezoelectric sensor element matrix 10.

When all the rows and columns of the piezoelectric sensor element matrix 10 are simultaneously connected to the ADC channels 31 of the microcontroller 30, there is no latencies related to otherwise required "select one row, scan all columns, select next row, scan all columns" method, which would take time considering all the settle times of the piezoelectric sensor elements and high impedance filter circuits etc. In addition, after very fast consecutive or parallel collection ("sampling") of signals originating from piezoelectric sensor elements 11, by controller 30 using all ADCs 31 connected to the piezoelectric sensor matrix 10, it is fast and efficient for the controller 30 to check whether any voltage difference between signal values acquired as representations of voltages at rows and columns in piezoelectric sensor matrix 10, exceeded the sensitivity threshold set for the touch event and thus representing for example that the piezoelectric sensor element 11 with connections from its terminals to the said row and column signals in the piezoelectric sensor element matrix 10, was touched.

There is no need to feed energy or such signals to the piezoelectric sensor element matrix 10, of which time constants, capacitances or similar characteristic changes would be measured in relation to the fed signals, to correspond with pressure on the piezoelectric sensor elements 11. Any measured changes in the measured signals at ADCs 31 by the controller 30 in the described circuits are originating from piezoelectric sensor elements 11, by the energy generated in the piezoelectric effect, when the piezoelectric sensor element 11 is deformed under pressure produced for example by user's touch to the user interface utilizing the piezoelectric sensor elements 11.

While the following embodiments use 16 piezoelectric sensor elements 11, it should be understood that the number of piezoelectric sensor elements 11 can be varied, and is not limited to 16. Furthermore, microcontroller 30 may, for example be a microcontroller, microprocessor, field programmable gate array, application specific integrated circuit, or any other device capable of running detection algorithm, with software, hardware or their combination, embedded in it.

Figure 1:
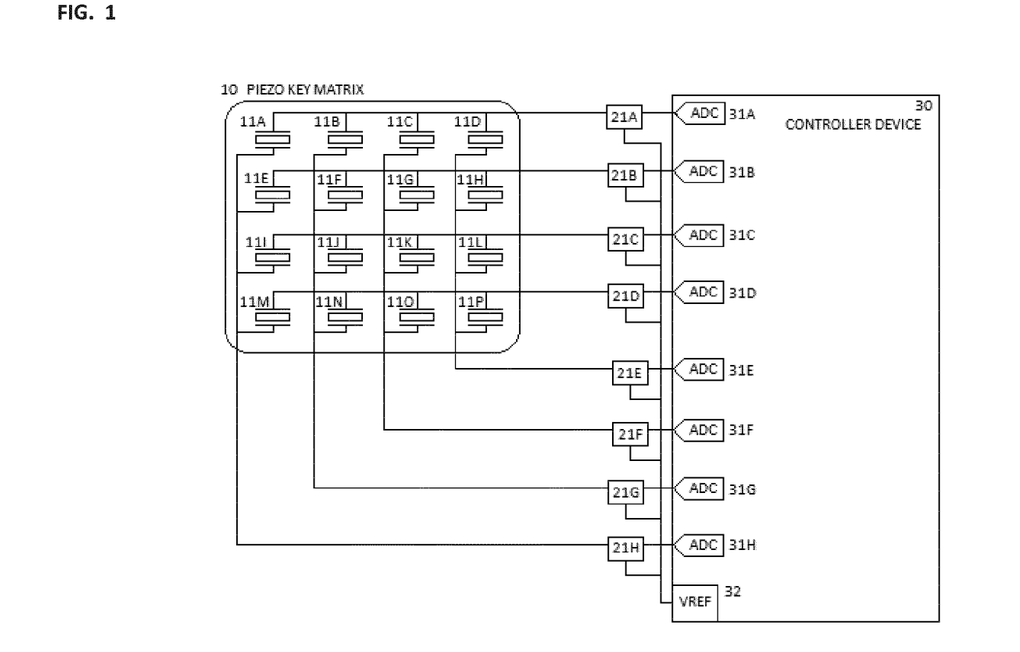
FIG. 1 illustrates a schematic representation of a detection circuit according to an embodiment.
Figure 5:
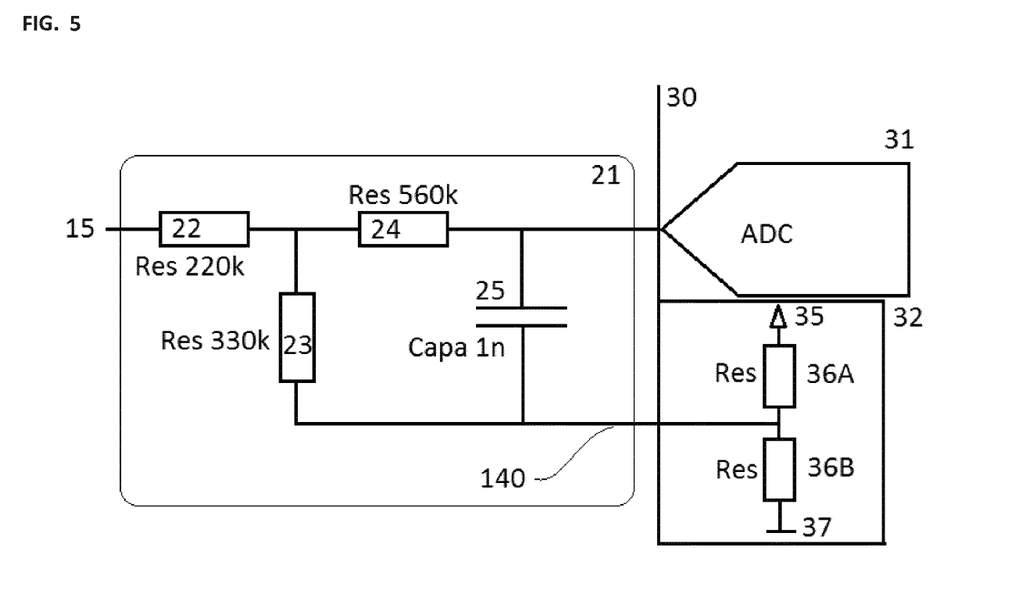
FIG. 5 illustrates a schematic representation of an implementation for a signal reference voltage creation and a signal conditioning circuit according to an embodiment.

Referring now to the embodiment of FIG. 1 there is shown 16 piezoelectric sensor elements 11 in a matrix 10, with the individual piezoelectric sensor elements 11A-11P, connected to a circuit that is composed of signal conditioning filters 21A-21H, and detection devices 31A-31H: analog-to-digital converters, as many as there are combined number of rows and columns of the matrix 10 to be detected. The 4 times 4 matrix thus requires 8 signal input channels at the controller device 30. The number of the ADCs 31 can be less, down to one, if the 8 channels are multiplexed inside the controller device 30. The number of the signal conditioning filters 21A-21H equals also to the number of rows and columns in the matrix 10. The controller device 30 also includes voltage reference circuit 32, VREF, which creates a suitable DC bias voltage for the piezoelectric sensor elements 11 in the matrix 10, to be able to have an alternating voltage signal detectable by the ADCs 31A-31H, within a signal range suitable for the ADC(s). An embodiment of the signal conditioning filters 21A-21H is shown in FIG. 5, where one possible topology is given for voltage amplitude attenuation of the piezoelectric sensor element 11 signal by resistive division by resistors 22 and 23, and frequency limitation by low pass filter elements 24 and 25. The electrical values of each resistors 22 and 23 can be selected to provide suitable conditioning effects, anything between zero ohms (no filtering) and high impedances (low frequency cut off). In FIG. 5, there is also an example of VREF circuit 32, implemented with a resistive voltage division 36A, 36B between supply voltage 35 and ground level 37, and the connection to the piezoelectric sensor element signal conditioning filter 21.

Referring to FIG. 1, the energy accumulated by a press of a piezoelectric sensor element 11, may momentarily deviate the voltage value related to the row and column of the piezoelectric sensor element matrix 10 connected to the terminals of said (touched) piezoelectric sensor element 11, which can be detected by the ADCs 31A-31H. From these read voltage signals in ADCs 31, the controller device 30 can recognize the individual piezoelectric sensor element 11 being pressed, touched, or swiped, by processing the analog-to-digital conversion results.

Figure 2:
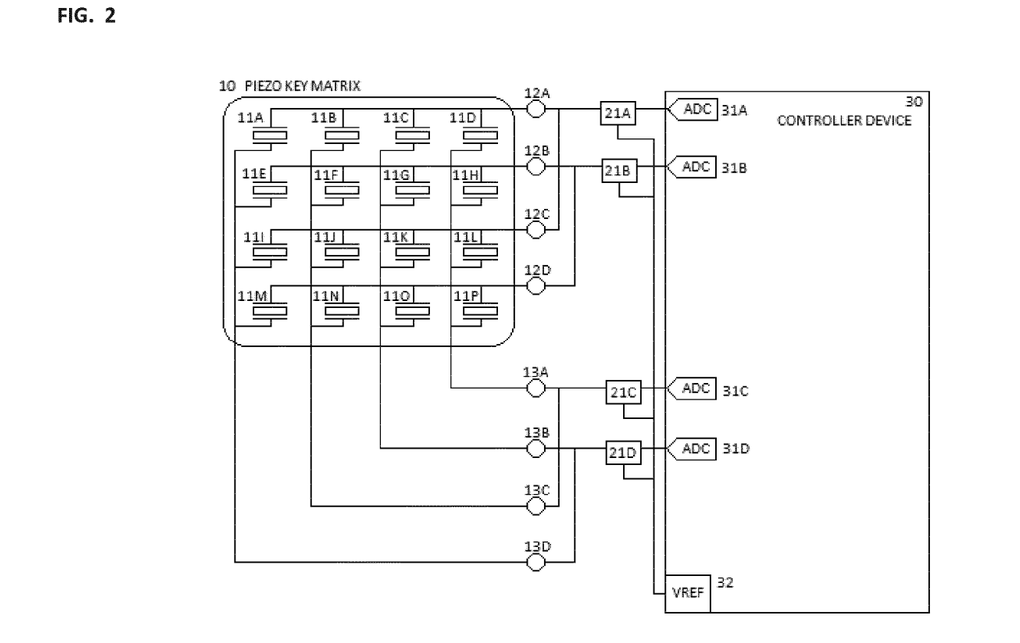
FIG. 2 illustrates a schematic representation of a detection circuit according to another embodiment.

In FIG. 2, there is illustrated an embodiment of the piezoelectric sensor element matrix 10, where electrical connections from columns and rows of the piezoelectric sensor element matrix 10 to controller 30 are multiplexed to save the number of detection devices 31A-31D inside controller 30. The multiplexing is done with a controlled switches 12A-12D for the rows, and 13A-13D for the columns of the piezoelectric sensor element matrix 10. The switches 12A-12D and 13A-13D are controlled by the controlled device 30, via digital signals that are merely for the sake of clarity not explicitly shown in the circuit in FIG. 2. The touch detection task in piezoelectric sensor element matrix may be performed with significantly lower number of detection devices 31A-31D needed compared to the embodiment illustrated in FIG. 1

Figure 3:
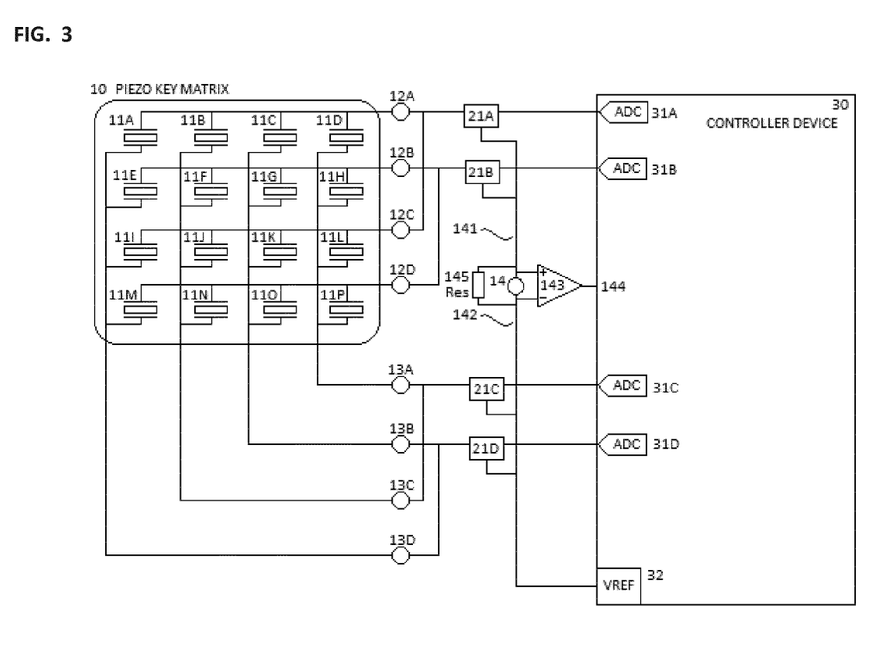
FIG. 3 illustrates a schematic representation of a low standby power wake-up circuit for the detection circuit according to an embodiment.

In FIG. 3, the configuration of FIG. 2 is equipped with a low power consumption wake-up trigger circuit, which consists of a controllable switch 14, which disconnects and connects the common reference nets 141 and 142, according to the control by the controller device 30. When the system is in a low power, stand-by state or inactive stage, not detecting with ADCs 31A-31D, thus not consuming energy for detection function, the common reference nets 141 and 142 are isolated by a non-conducting state of switch 14. To provide the nets the same DC bias voltage, a high ohmic value resistor 145 is connected parallel to the switch 14. An analog comparator 143 monitors the voltage difference between the two isolated common reference nets 141, 142. The analog comparator 143 may have predefined trigger voltage threshold level, which must be exceeded, to reliably distinguish desired touch detection signals from noise in the circuit. When a voltage difference produced by a piezoelectric sensor element 11 being touched is detected between the common reference nets 141, 142 by the analog comparator 143, it triggers the controller 30 to wake up, to turn the switch 14 conductive, and to start monitoring the rows and columns of piezoelectric sensor element matrix 10 by activating the detector ADCs 31A-31D. The wake-up sequence can be made in such a short time, that the touch detection and recognition in controller 30 from the signal of the same piezoelectric sensor element 11, which produced the signal for the wake-up, can still be reliably performed.

Figure 4:
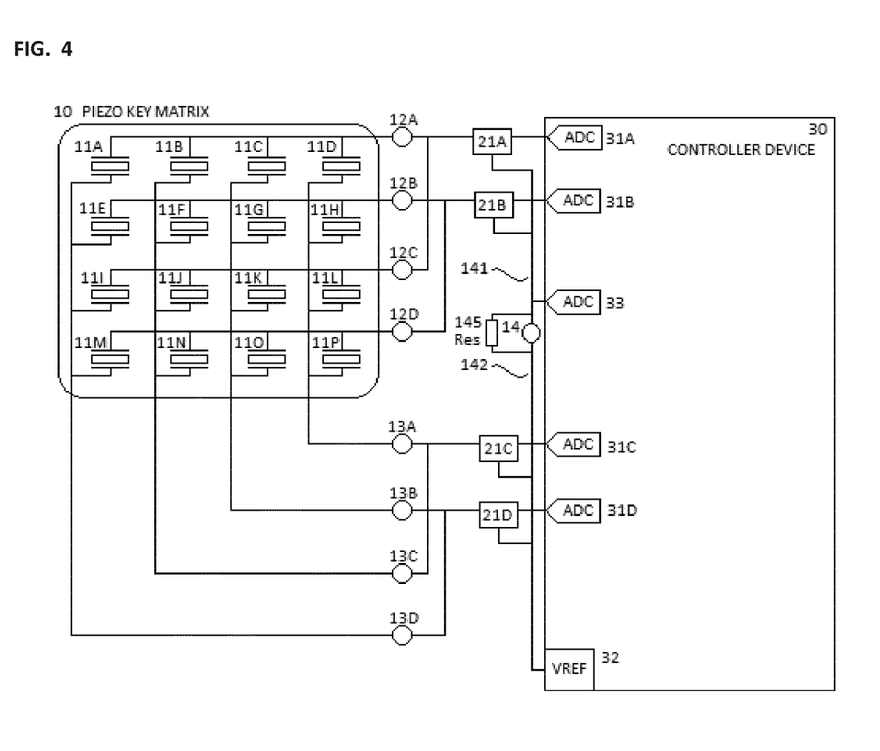
FIG. 4 illustrates a schematic representation of a low standby power wake-up circuit according to an embodiment.
Figure 6:
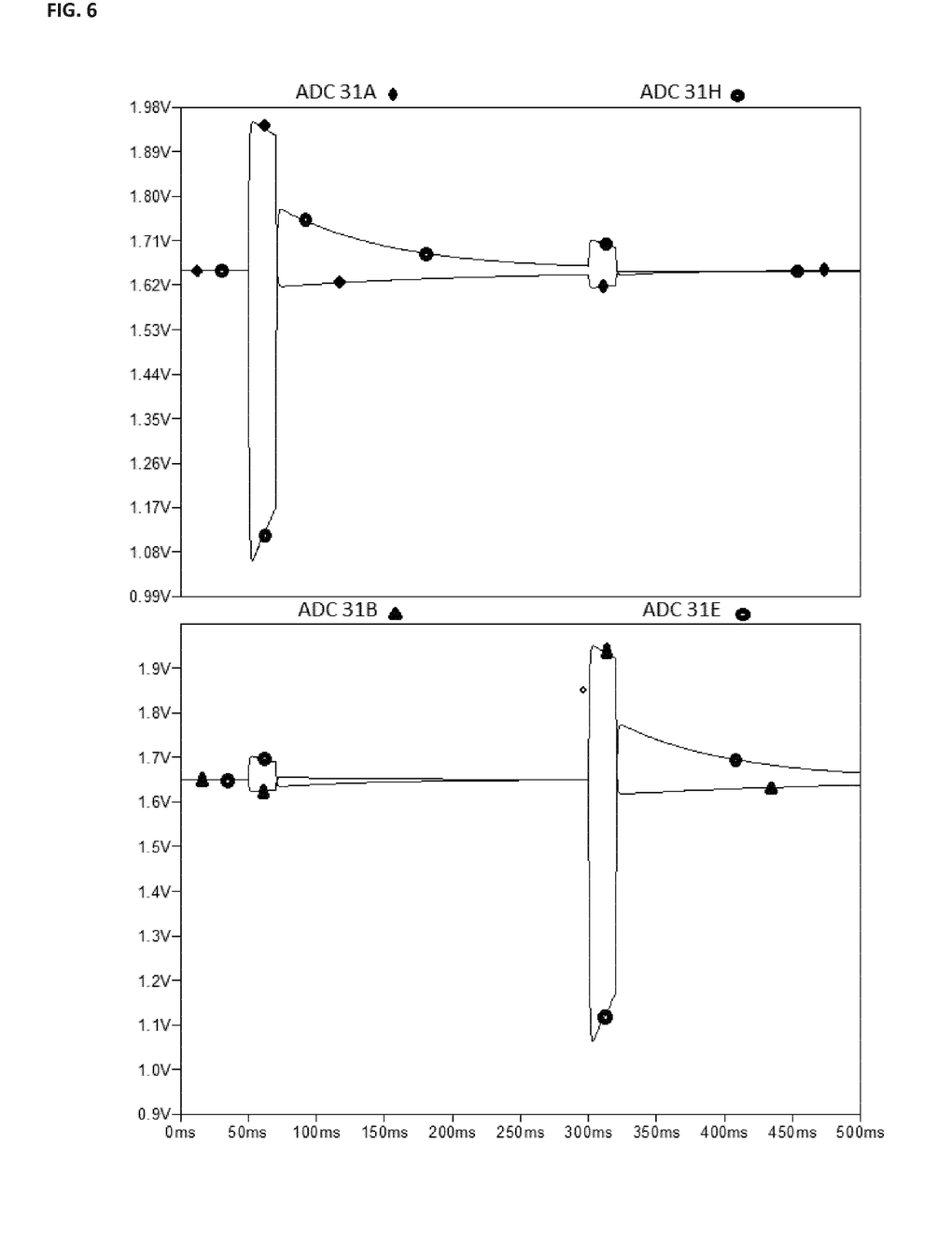
FIG. 6 illustrates a schematic representation of simulated piezoelectric sensor signals of a detection circuit illustrating an ability to detect a touch from piezoelectric sensor elements in a matrix of multiple rows and columns according to embodiment.

In FIG. 4 there is illustrated an embodiment for the low power wake-up trigger function, to detect the need to transition from stand-by mode to normal operation mode of the circuit, controlled by the controller 30. In this embodiment, another ADC channel 33, inside the controller 30, is utilized to detect the voltage changes between the common reference nets 141 and 142, which are first isolated from each other by disconnected switch 14, but having the same DC bias voltage via high ohmic resistor 145, parallel to the switch. When the ADC 33 detects voltage change between the common reference nets 141, 142, the controller device 30 activates the ADCs 31A-31D, and connects the common reference nets 141, 142 together, making the VREF net common to all detectable channels. In FIG. 6, simulated voltage curves shown in time domain represent the signals at the ADC inputs 31, which the detection of the touch and recognition of the touched piezoelectric sensor element 11 is based on. The voltage curves are captured from a single touch recognition test, where piezoelectric sensor element 11A of FIG. 1 is pressed at 50 msec, for 20 msec period, and piezoelectric sensor element 11H of the same FIG. 1 is pressed at 300 msec, for 20 msec period. The upper curves indicate the detected signals originated from piezoelectric sensor element 11A at row of piezoelectric sensor element matrix 10 which is connected to ADC 31A, and detected signals originated from the same piezoelectric sensor element 11A at column of piezoelectric sensor element matrix 10, which is connected to ADC 31H of FIG. 1. The lower curves indicate the signals originated from piezoelectric sensor element 11H connected to row and column of the matrix 10, as detected at ADC 31B and ADC 31E of FIG. 1, respectively.

To detect the row and the column of the touched piezoelectric sensor element 11 in the matrix 10, the larger difference of the piezoelectric sensor element 11 originated signal amplitudes of a column and a row of the piezoelectric sensor element matrix 10 is found at the ADCs 31, in comparison to any other piezoelectric sensor element 11 originated signal differences of other columns and rows in the piezoelectric sensor element matrix 10, or to predetermined reference value stored in controller 30. In other words touch detection is made based on large enough signal difference measured by ADC 31 from the column and row of the matrix 10, which exceed the signal difference of other columns and rows of the matrix 10 measured by ADC 31, and/or a set sensitivity threshold for touch detection stored in controller 30.

The other ADCs 31, connected to rows and columns of the matrix 10 where the piezoelectric sensor elements 11 are not touched, detect significantly lower signals in comparison to the ADCs 31 connected to the rows and columns of the matrix 10 where the piezoelectric sensor element 11 is touched. This is indicated in FIG. 6 by signals of ADC 31A and 31H at 300 msec, upper curves, and ADC 31B and 31E at 50 msec, lower curves. There can be several piezoelectric sensor elements 11 of the matrix 10 of FIG. 1 touched, pressed, swiped, or otherwise actuated by the user at the same time, providing large enough signal differences on several pairs of rows and columns of the piezoelectric sensor element matrix 10, which can be detected and recognized in microcontroller 30 by the same principle. The different and adjustable sensitivity thresholds can be used for recognition of different kind of touch events in the microcontroller 30.

The functionality described herein can be performed, at least in part, by one or more computer program product components such as software components. According to an embodiment, the device comprise a processor, such as the microcontroller 30, configured by the program code when executed to execute the embodiments of the operations and functionality described. Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), Graphics Processing Units (CPUs).

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A device, comprising:
   a matrix of piezoelectric sensor elements comprising rows of the piezoelectric sensor elements and columns of the piezoelectric sensor elements;
   measuring circuits configured to detect at least one touch, wherein the measuring circuits are configured to the rows and to the columns; and
   a wake-up trigger configured to detect the at least one touch and further configured to trigger the matrix to an operation mode when the at least one touch is detected
   wherein the wake-up trigger is connected between isolated common reference nets and the wake-up trigger is configured to monitor a voltage difference between the isolated common reference nets, wherein the wake-up trigger further comprises a switch, and wherein the wake-up trigger is configured to connect and disconnect the isolated reference nets by the switch and accordingly turn the switch on for activating the matrix to the operation mode.

2. The device of claim 1, wherein the matrix is configured to a low-power mode, stand-by mode or inactive mode, until the matrix is triggered by the wake-up trigger.

3. The device of claim 1, wherein the wake-up trigger is configured to maintain an analog comparator to monitor the detection of the at least one touch.

4. The device of claim 1, wherein the wake-up trigger is configured to maintain an analog to digital converter, ADC, channel to monitor the detection of the at least one touch.

5. The device of claim 1, further including a controller configured to detect a different sensitivity threshold based on the at least one touch or multiple touches in order to recognize different kind of touch events.

6. The device of claim 5, wherein the controller is configured to detect multiple touches of the matrix at same time.

7. The device of claim 6, wherein the controller is configured to detect predetermined signal differences on pairs of rows and columns in order to detect the multiple touches.

8. The device of claim 5, wherein the controller is configured to detect a signal difference between a signal of the at least one touch and any other piezoelectric sensor element originated signal in order to recognize the at least one touch and ignore the other piezoelectric sensor element originated signal.

9. The device of claim 1, wherein other measuring circuits connected to the rows and columns, where the piezoelectric sensor elements are not touched, detect significantly lower signals in comparison to measuring circuits connected to the rows and columns, where the piezoelectric sensor element is touched.

10. The device of claim 5, wherein the controller is configured to detect a polarity of a signal of the at least one touch and a polarity of any other signal of the piezoelectric sensor element and compare the signals in order to identify the at least one touch.

11. The device of claim 1, wherein the wake-up trigger comprises an analogy comparator wherein the comparator is configured to turn the switch on for activating the matrix to the operation mode.

12. The device of claim 5, wherein the wake-up trigger comprises an analog to digital converter, ADC, channel configured to monitor a voltage difference between isolated common reference nets, and wherein the wake-up trigger further comprises a switch, wherein the controller is configured to turn the switch on for activating the matrix to the operation mode.

13. The device of claim 11, further including a resistor in parallel to the switch.

14. The device of claim 1, wherein the measuring circuits comprise signal conditioning filters and detection devices.

15. The device of claim 1, wherein the measuring circuits are configured to only for each row and each column.

16. The device of claim 1, wherein the measuring circuits further comprise one or more controlled switches configured to multiplex channels of each row and each column.

17. A method, comprising:
- detecting, by measuring circuits, at least one touch, wherein the measuring circuits are configured to rows and to columns, and wherein a matrix of piezoelectric sensor elements comprises the rows of the piezoelectric sensor elements and the columns of the piezoelectric sensor elements, and wherein the piezoelectric sensor elements cause a signal to the at least one touch; and
- detecting, by a wake-up trigger, the at least one touch; and
- triggering the matrix to an operation mode when the at least one touch is detected;
- wherein the wake-up trigger is connected between isolated common reference nets and the wake-up trigger is configured to monitor a voltage difference between the isolated common reference nets, wherein the wake-up trigger further comprises a switch, and wherein the wake-up trigger is configured to connect and disconnect the isolated reference nets by the switch and accordingly turn the switch on for activating the matrix to the operation mode.

18. A computer program comprising program code configured to perform a method according to claim 17 when the computer program is-executed on a computer, and wherein the computer program is stored via non-transitory computer readable media.

* * * * *